United States Patent [19]

Adams

[11] 4,217,375
[45] Aug. 12, 1980

[54] DEPOSITION OF DOPED SILICON OXIDE FILMS

[75] Inventor: Arthur C. Adams, Berkeley Heights, N.J.

[73] Assignee: Bell Telephone Laboratories, Incorporated, Murray Hill, N.J.

[21] Appl. No.: 829,188

[22] Filed: Aug. 30, 1977

[51] Int. Cl.$^2$ ............................................. H01L 21/18
[52] U.S. Cl. ........................................ 427/85; 427/95; 148/174
[58] Field of Search ........... 427/85, 95, 248 B, 248 C; 148/174

[56] References Cited

U.S. PATENT DOCUMENTS

| | | | |
|---|---|---|---|
| 3,117,838 | 1/1964 | Sterling et al. | 148/187 |
| 3,200,019 | 8/1965 | Scott, Jr. et al. | 427/85 |
| 3,476,619 | 11/1969 | Tolliver | 148/187 |
| 3,481,781 | 12/1969 | Kern | 427/126 |
| 3,485,666 | 12/1969 | Sterling et al. | 148/187 |
| 3,681,155 | 8/1972 | Elgan et al. | 427/85 |
| 3,690,969 | 9/1972 | Hays et al. | 148/187 |
| 3,698,071 | 10/1972 | Hall | 427/248 C |
| 3,808,060 | 4/1974 | Hays et al. | 148/187 |
| 3,892,606 | 7/1975 | Chappelow | 427/85 |
| 4,002,512 | 1/1977 | Lim | 148/174 |
| 4,034,130 | 7/1977 | Briska et al. | 427/95 |

OTHER PUBLICATIONS

Sterling et al., Solid–State Electronics, Pergamon Press, 1965, pp. 653–654.
Alexander et al., Thin Film Dielectrics, Electrochem. Soc. Conference (1970), pp. 186–208.

Primary Examiner—Ralph S. Kendall
Attorney, Agent, or Firm—Bruce S. Schneider

[57] ABSTRACT

A method of depositing doped silicon dioxide layers in the fabrication of semiconductor devices has been found. This method entails the reaction of a mixture of silane, nitrous oxide and a source of a dopant, e.g., phosphine or diborane. The reaction is performed at relatively high temperature, typically between 800 and 900 degrees C., and excellent step coverage is obtained. Further, the pinhole problems previously associated with high temperature techniques are avoided. Lower dopant concentrations, e.g., below 6%, are also practical.

7 Claims, 1 Drawing Figure

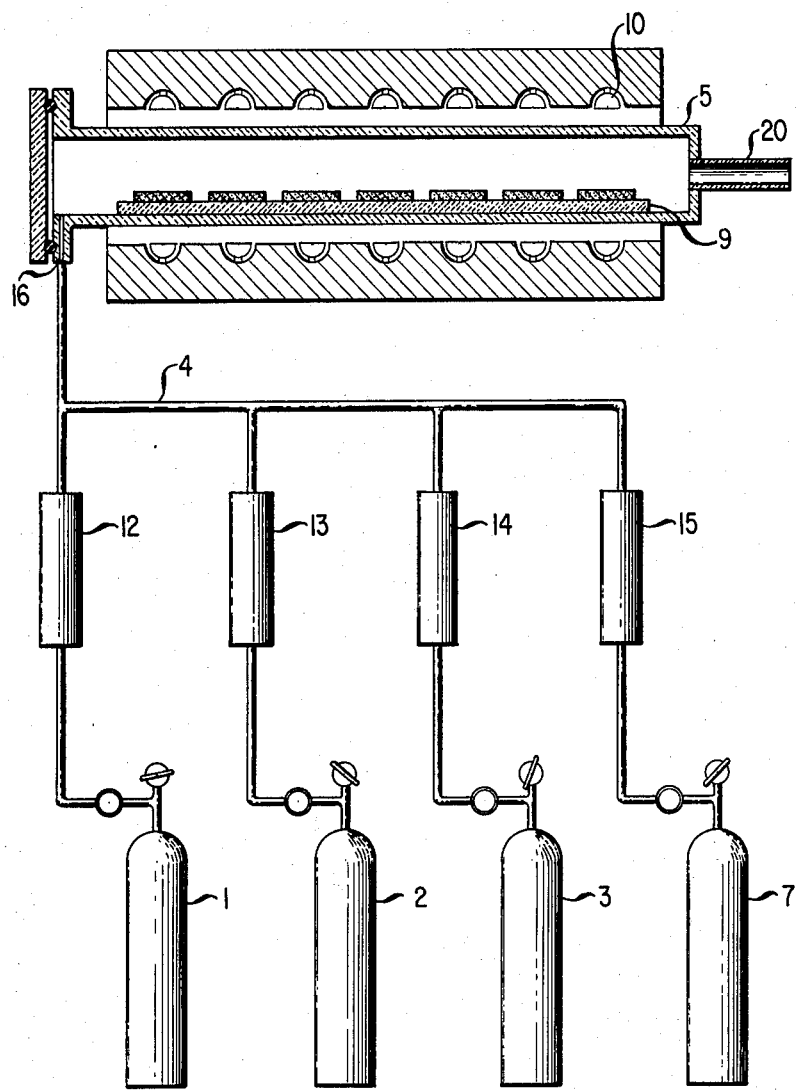

DEPOSITION OF DOPED SILICON OXIDE FILMS

BACKGROUND OF THE INVENTION

1. Field of the Invention

This invention relates to the production of semiconductor devices and, more particularly, to the production of such devices employing silicon.

2. Description of the Prior Art

A number of processing steps are required in the manufacture of a typical semiconductor device. Various levels of a device are formed in a succession of deposition steps. After these depositions, a semiconductor body, typically with a step-type geometry, is obtained. A common practice is to make the device planar by filling in these steps with an insulating material. Further, it is often desirable for this insulating deposited layer to act as a passivating layer (a layer which scavanges impurities either from the ambient atmospheres or from the contiguous semiconductor layers). To make the layer passivating, a dopant is added to the insulating material, e.g., silicon dioxide, during deposition. After the insulating layer is deposited as a final step in the preparation of the semiconductor device, a metal contacting layer, e.g., a layer of aluminum, is deposited on the insulating layer.

Many methods have evolved for the deposition of undoped silicon dioxide in the fabrication process previously described. For example, deposition mixtures of silane, carbon dioxide and hydrogen; silane and nitric oxide; or silane and nitrous oxide have been used satisfactorily. On the other hand, the deposition of doped silicon dioxide passivating layers presents problems unanticipated in the undoped silicon dioxide deposition methods.

A prime requisite for deposition of a passivating layer is that good step coverage is obtained. Several methods of depositing doped silicon dioxide layers have been developed in an attempt to satisfy this requisite. A first method entails the high temperature (typically 700 to 800 degrees C.) deposition reaction of an organo-silicon material with an organo-dopant material, e.g., organo-phosphorus or organo-boron compounds. As a result of the high temperatures used, the step coverage obtained is adequate. However, also due to the high temperatures used during the deposition process, silicon dioxide forms as particles on the walls of the reactor and subsequently falls into the structure being fabricated. These discrete silicon dioxide particles ultimately cause formation of pinholes in the final device which, in turn, severely degrade the obtainable electrical properties.

A low-temperature (typically 300 to 500 degrees C.) method has also been used for depositing a doped silicon dioxide layer. This method utilizes the reaction of silane, oxygen, and a dopant source, e.g., phosphine or diborane. The low temperature utilized, by itself, ensures pinhole free devices, but also yields poor step coverage. To improve the step coverage of this method an additional reflowing step is employed, i.e., the deposited, doped silicon dioxide is heated to a temperature typically between 1050 and 1150 degrees C.

Although reflowing improves the step coverage, it introduces further complications. The deposited, doped silicon dioxide layer does not readily melt in the reflowing step unless dopant concentrations greater than 7% are used. However, dopant levels exceeding 8% cause corrosion of the continuous aluminum contact layer through production of corrosive compounds, e.g., phosphorus dopants react with the moisture in the air to produce phosphoric acid.

Thus, if a reflow method is used, dopant concentrations in the silicon dioxide layer must be strictly limited to the narrow range between 7 and 8%. Because the dopant typically comprises no more than a few percent of the total gas flow used during deposition, and because it is difficult to control precisely the flow of the small quantities of dopants in the reaction mixture, it is very difficult to maintain this necessary concentration range in the deposited layer.

SUMMARY OF THE INVENTION

The problems of both the high- and low-temperature production of passivating silicon dioxide films utilizing phosphorus or boron dopants are overcome by employing a gas mixture of silane, nitrous oxide and an appropriate source of dopant. The deposition reaction is done at high temperatures, typically 800 to 900 degrees C., thus insuring excellent step coverage. It has been found that the nitrous oxide, silane and the source of dopant do not react to form particulate matter and that pinholes are avoided. Dopant concentrations in the range up to 6% are practical since a reflowing step is not necessary.

BRIEF DESCRIPTION OF THE FIGURE

The FIGURE is a schematic of a deposition apparatus suitable for the practice of the invention.

DETAILED DESCRIPTION

The invention entails a chemical vapor deposition (CVD) process using a silane-nitrous oxide-dopant gas flow for depositing doped layers of silicon dioxide. The apparatus schematically represented in FIG. 1 has been found convenient for the practice of the invention. The equipment consists of gas cylinders 1, 2, 3 and 7, a gas manifold 4; and a quartz reaction chamber 5, with a rectangular cross-section. Before use, the apparatus is cleaned to prevent any adsorbed impurities from contaminating the deposited layer. This cleaning is done, for example, by immersing the quartz chamber in a 1:3 solution of HF in $HNO_3$. Cleaning is repeated sufficiently often to prevent unacceptable contamination, typically every 40 runs. Substrates are placed on a graphite substrate holder 9, and inserted into the apparatus. Before starting the deposition process, the entire apparatus, including the cleaned chamber, is flushed with an inert gas, for example, $N_2$, to exclude oxygen or other reactive compounds. The substrates are then heated. The method of heating the substrates is not critical. However, it is convenient to provide the necessary heat by using a series of lamps 10, whose radiant energy is directed through the quartz chamber onto the substrates. The walls of the quartz chamber are cooled, for example, by flowing air over the outside surface to prevent deposits from forming on the chamber. Since the deposits formed on the walls are usually opaque, this precaution is particularly important when using lamps for heating.

The reaction gas flow is composed of silane, nitrous oxide and a source of a dopant. In the preferred embodiment, $PH_3$ is used as a source of phosphorus dopant. However, alternative dopant sources such as triethylphosphate, triethylphosphite, trimethylphosphate, trimethylphosphite, phosphorus tribromide and phosphorus oxychloride are also useful. Unlike phosphine these other exemplary sources of dopants are liquids.

They are conveniently introduced as gases by passing oxygen through a bubbler containing the desired liquid source of dopant. The oxygen is needed in this situation since these liquids are harder to oxidize than $PH_3$. Bubbler temperatures in the range 20 to 70, preferably 40 to 60 degrees C., are generally useful for this purpose. It has also been found that boron doped layers are obtainable under similar conditions to those described below by using $B_2H_6$ as a source of the dopant.

The reaction gases are stored in tanks 1, 2 and 3 and introduced through their respective metering values 12, 13 and 14, into the manifold 4. An inert carrier gas, for example, nitrogen, stored in cylinder 7 is also introduced into the manifold through valve 15. For convenience, sufficient carrier gas is typically used to maintain the total gas pressure including the partial pressure of the reactant gases at 1 atmosphere. The process is continued with the reactants entering the reaction chamber at 16 from manifold 4, passing over the deposition substrates, and exiting the reaction chamber through exhaust tube 20.

In device fabrication, after the doped silicon dioxide layer is deposited by the inventive process, windows are etched through the layer at the appropriate place to form contact to the active semiconductor regions in the device. If the etch rate is not sufficiently uniform throughout the silicon dioxide layer, the etching is erratic and inadequate contacts result. Irregular etch rates are usually caused by gradients in the thickness of the silicon dioxide layer and/or by concentration gradients of the dopant in the layer.

It has been found that, under some circumstances, for example, when the substrates to be coated occupy a short distance in the direction of the gas flow e.g., less than 23 cm, in a 8 by 50 cm rectangular reaction zone, variations in thickness and dopant concentration are negligible. However, when the substrates occupy a longer distance, e.g., between 23 and 50 cm in the same chamber, measurable gradients in both quantities may occur in the substrates. The size of the gradient naturally varies to a certain extent with the size of the chamber, gas flow rate, and reactant concentration. However, as explained below, for typical equipment and conditions the effect of these variations on etch rate are avoided by appropriately controlling the substrate temperature and relative concentrations of the reactants in the gas flow.

Etch rate varies more strongly with the absolute value of the dopant concentration (quadratic dependence) than with layer thickness (linear dependence). Therefore, maintenance of a relatively low dopant concentration throughout the $SiO_2$ layers is an essential and dominant factor in limiting variations in etch rate. For layers deposited by the inventive process in situations where uniformity is not insured, i.e., when substrates occupy a substantial length of the chamber in the direction of the gas flow, the process parameters, (substrate temperature and reactant gas concentration), should be adjusted to yield a dopant concentration lower than approximately 2% by weight. (Although for certain applications such as backside gettering or diffusion sources and for coating a more limited number of substrates, dopant concentrations as high as 6% produce acceptable $SiO_2$ layers.) However, dopant concentrations in the final deposited layer, below $\frac{1}{2}$ of a percent by weight, are generally not useful in device applications. Below this lower limit the dopant does not efficiently getter impurities from the adjacent semiconductor layers or from the surrounding atmosphere.

To obtain dopant concentrations within the $\frac{1}{2}\%$ to 6%, preferably $\frac{1}{2}$ to 2% ranges specified, substrate temperatures between 800 degrees C. and 900 degrees C., preferably between 800 degrees C. and 850 degrees C., are used. (Temperatures between 750 degrees C. and 900 degrees C. are suitable for boron containing sources of dopant.) Exemplary of the concentration of reactants in the gas flow useful within this temperature range, is partial pressures over the substrates of 0.03 to 0.09 atm preferably 0.06 to 0.07 atm nitrous oxide; 0.0001 to 0.0003 atm, preferably 0.0002 to 0.0003 atm silane; and 0.000003 to 0.00003 atm, preferably 0.000005 to 0.00003 atm of the source of dopant, e.g., $PH_3$. The remainder of the gas flow is composed of inert gas, i.e., gas which does not interfere with the desired reaction. Suitable pressures for the total gas flow are between about 0.9 and 1.2 atm, preferably between 1.0 and 1.1 atm. Within these limitations of reactant concentration, total gas flow, and pressure, situations are encompassed where the system operates at a partial vacuum. Such situations are within the ambit of the invention. However, it is generally most convenient to work at pressures in the range of 1 atm through the addition of an appropriate amount of inert gas.

Within these concentration ranges, the specific reactant concentrations used depends to a certain extent on the particular substrate temperature employed. For example, acceptable etch rate uniformity is obtained at a substrate temperature of 825 degrees C. if the concentration of nitrous oxide, silane and $PH_3$ is respectively 0.068, 0.0003, and 0.000006 atm. If a temperature of 850 degrees C. is used, the preferred reactant concentrations are 0.068, 0.0002, and 0.00003 atm.

Typical deposition rates obtainable are between 550 and 600 angstroms/min for coating 14 substrates, 3 inches in diameter (occupying 50 cm of the chamber). For typical device applications an $SiO_2$ layer of between $0.9\mu$ and $1.3\mu$ thickness is deposited. This layer thickness requires deposition times between 15 and 23 min.

EXAMPLE 1

Silicon wafers measuring 3 inches in diameter were cleaned in a 1:1:4 solution of $NH_4OH/H_2O_2/H_2O$. The substrates were immersed for 10 minutes in this boiling solution and then rinsed in deionized water. The wafers were dried by spinning in a centrifuge and then placed for 30 minutes in a 1,100 degree C. furnace with a pure oxygen atmosphere. After the wafers were removed from the furnace they were treated for 1 minute in a 1:100 solution of HF in water and again rinsed in deionized water before being spun dry. Polycrystalline silicon 5000 Angstroms thick was deposited on the wafers at 700 degrees C. The polycrystalline silicon was doped with phosphorous using $PBr_3$ at 1000 degrees C. The reaction chamber of a Nitrox reactor was cleaned by immersion in a 1:3 solution of HF in $HNO_3$. Fourteen of the cleaned wafers were then placed on the substrate holder of the Nitrox reactor (a horizontal chemical vapor deposition apparatus with a rectangular quartz reaction chamber manufactured by Applied Materials, Inc.). The entire device was purged with nitrogen for approximately 5 min.

A reaction mixture of phosphine, silane and nitrous oxide in a ratio of 1:50:11,000 was introduced into the reaction chamber. This reaction mixture was combined, before introduction into the chamber with sufficient nitrogen to produce a total pressure of 1 atmosphere. The partial pressure of the reactant gases was approximately 7% of the total pressure. The flow rate of the combined gas mixture was regulated to be about 140 l/min. Air was blown over the outside of the rectangular reaction chamber, and heating lamps on the outside of the chamber were set to irradiate the substrates producing a temperature of approximately 825 degrees C. The gas flow was continued for about 17 minutes before the reaction was terminated and the substrates removed.

The procedure produced a doped silicon dioxide layer approximately 1.0μ thick having a phosphorus containing dopant level of about 0.9%. The substrates were later etched to make contact to the silicon wafer. The silicon dioxide layers exhibited a variation in etch rate of only approximately 10% throughout the 14 wafers prepared.

EXAMPLE 2

The same procedure was repeated as described in example 1, except $B_2H_6$ was used instead of $PH_3$ as the source of dopant. The substrate temperature was 760 degrees C. and the ratio of silane to nitrous oxide to $B_2H_6$ was 10:2200:1. Etch rates in the $SiO_2$ layers of the coated silicon wafers showed variations of about 12%.

What is claimed is:

1. A process for depositing a doped insulating material comprising the steps of passing a gaseous reaction mixture containing silane and a dopant source over a heated deposition substrate and depositing doped silicon dioxide on said deposition substrate CHARACTERIZED IN THAT said gaseous reaction mixture comprises nitrous oxide, silane and a dopant source, that said deposition substrate is maintained at a temperature in the range from about 800 to 900 degrees C., and that said doped silicon oxide is doped with a phosphorus containing compound to a concentration between about ½ and 6 percent by weight of said silicon oxide by the addition of said dopant source to said reaction mixture.

2. The process of claim 1 wherein said deposition substrate is a body having a plurality of semiconductor layers.

3. The process of claim 1 wherein said dopant source is $PH_3$.

4. The process of claim 1 wherein said dopant concentration is in the range ½ to 2 percent by weight of said silicon oxide.

5. The process of claim 1 wherein the ratio of nitrous oxide to silane in said gaseous reaction mixture is in the range of 100 to 900.

6. A process for depositing a doped insulating material comprising the steps of passing a gaseous reaction mixture containing silane and a dopant source over a heated deposition substrate and depositing doped silicon dioxide on said deposition substrate CHARACTERIZED IN THAT said gaseous reaction mixture comprises nitrous oxide, silane and a dopant source, that said deposition substrate is maintained at a temperature in the range from about 750 to 900 degrees C., and that said doped silicon oxide is doped with a boron containing compound to a concentration between about ½ and 6 percent by weight of said silicon oxide by the addition of said dopant source to said reaction mixture.

7. The process of claim 6 wherein said dopant source is $B_2H_6$.

* * * * *